United States Patent [19]

Smith

[11] 3,825,851

[45] July 23, 1974

[54] AUDIO THRESHOLD LEVELER WITH NOISE LEVEL SUPPRESSOR

[75] Inventor: John F. Smith, Warminster, Pa.

[73] Assignee: Narco Scientific Industries, Inc., Fort Washington, Pa.

[22] Filed: Aug. 6, 1973

[21] Appl. No.: 385,729

Related U.S. Application Data

[63] Continuation of Ser. No. 218,986, Jan. 19, 1972, abandoned.

[52] U.S. Cl. .................................... 330/29, 330/28

[51] Int. Cl. ............................................ H03g 3/30

[58] Field of Search ......... 330/28, 29, 145; 325/319

[56] References Cited

UNITED STATES PATENTS 3,303,428 2/1967 Zentmaier et al. .................. 330/29

*Primary Examiner*—Herman Karl Saalbach
*Assistant Examiner*—James B. Mullins
*Attorney, Agent, or Firm*—Paul and Paul

[57] ABSTRACT

In a radio receiver, an audio threshold leveler and noise level suppressor, for keeping the audio output level constant for input signals above a threshold level, and providing no signal output for detected audio inputs less than receiver noise. The first stage employs in its input a diode connected to conduct at low input audio levels so that it holds the active device of the stage at a low gain point of operation, and to be back biased as the input audio signal is increased, thereby causing AC degeneration which counteracts the increasing device gain. The output from the first stage is coupled through cascaded amplifier stages to a peak detector which derives a signal representative of the input audio level, which signal is connected to and biases the first stage diode so as to achieve the desired circuit response.

6 Claims, 2 Drawing Figures

AUDIO THRESHOLD LEVELER WITH NOISE LEVEL SUPPRESSOR

CROSS-REFERENCE TO RELATED APPLICATION

This application is a continuation of U.S. Ser. No. 218,986, filed Jan. 19, 1972, now abandoned, and assigned to the same assignee.

BACKGROUND OF THE INVENTION

A. Field of the Invention

This invention lies in the field of audio levelers and, more particularly, audio levelers, or AGC circuits, for suppressing the output under no signal conditions to keep the noise level at a minimum, and providing a substantially flat gain characteristic above a threshold audio input level.

B. Description of the Prior Art

In communication systems, and particularly in aircraft radio receivers, there is a great need for effective audio leveling so that the audio signal which is received stays appreciably constant and does not vary with changes in signal strength and modulation index. A great many audio leveler type circuits have been used in the art, with varying degrees of success. With a sufficiently complex design, it is possible to approximate the desired input-output leveler characteristics. However, as is well known, with increased complexity of the circuit also comes decreased reliability, as well as increased expense. Thus, there remains a continuing need in the art for more efficient audio leveler, or AGC circuits, having well defined threshold points, and which provide a close approximation of ideal characteristics. Further, it is also highly desirable that an audio leveler circuit be designed so as to eliminate any noise which has come through the communications system to the input of the leveler. This may be achieved by designing the circuit to yield no output for all received audio signals of strength less than the maximum noise input, and providing an output that increases sharply as the signal input is increased from above the noise level to that which corresponds to a desired threshold level.

SUMMARY OF THE INVENTION

It is an object of this invention to provide an audio leveling circuit providing no output for input signals up to a first predetermined level, thus suppressing noise, providing a linearly increasing output corresponding to input levels up to a second predetermined level, which second level is referred to as a threshold level, and a substantially constant output for all input signals greater than such threshold level.

It is a further object of this invention to provide such a circuit as described above which is simple in operation, requires a minimum of components, and which is inexpensive and reliable.

In accordance with the above objectives, there is provided an audio leveler circuit having a plurality of cascaded active stages, the last of such stages operating as a peak detector to generate a DC voltage proportional to the audio input level, and having a feedback path from the output of said peak detector circuit connected to a diode in the input circuit of the first stage, such that the feedback voltage controls the DC operation of such first stage and thus the gain, and also controls the amount of dynamic degeneration and thus the AC gain of the stage. The diode is connected in series with a capacitor which provides an AC path to ground, which path shunts a degeneration resistor connected in the input circuit of the first stage. The feedback signal affects the degree of back bias of the diode, such that for large signals the back bias is increased, decreasing the AC bypass and causing increased dynamic degeneration. At low signal levels, a high current path is provided through the diode, the feedback path and the last stage, so as to hold the first stage at a low end of its gain-current curve, thus suppressing any audio output for inputs below the noise level of the device.

DESCRIPTION OF THE PREFERRED EMBODIMENT

Figure 1:
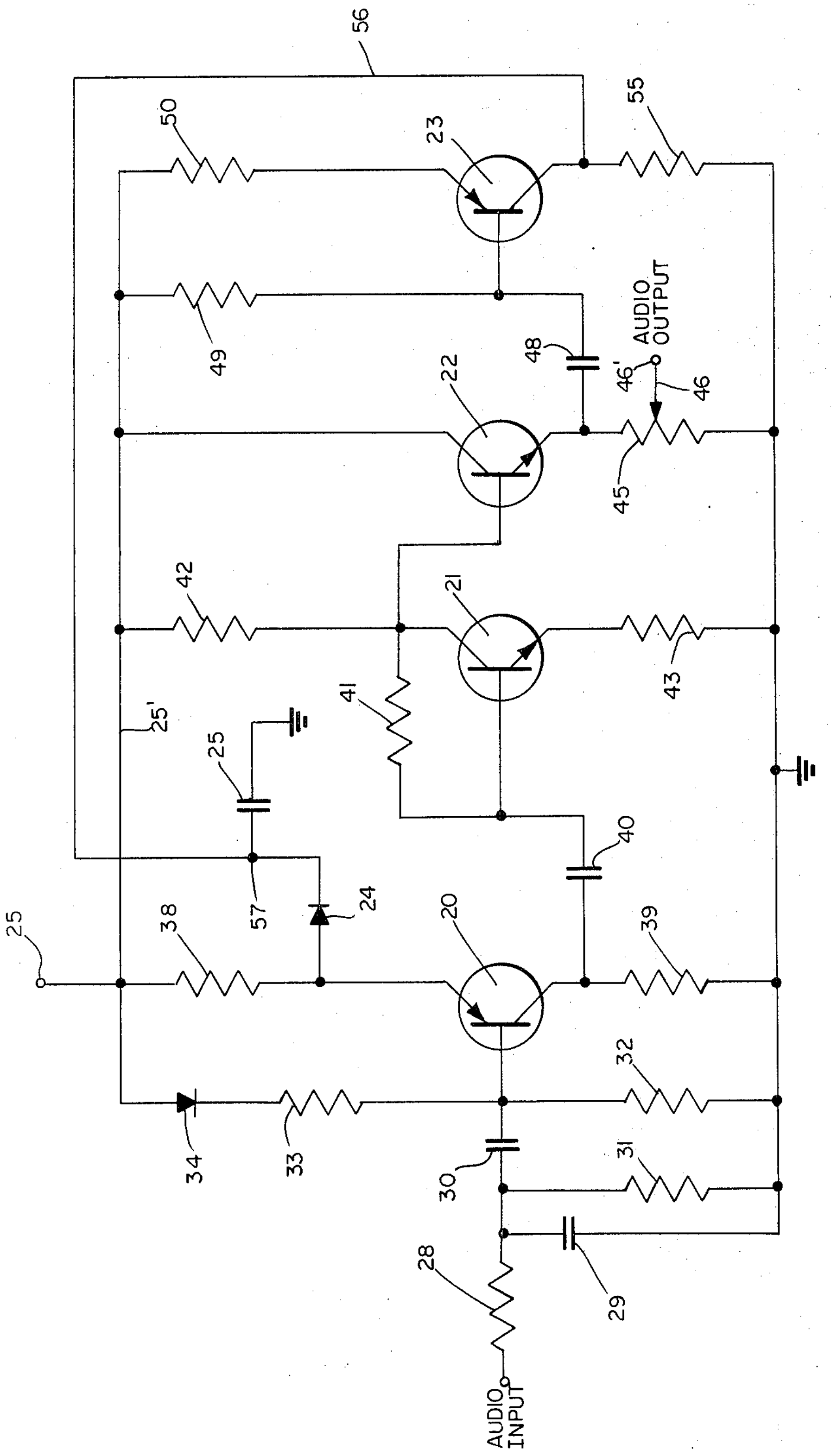
FIG. 1 is a circuit diagram of the audio leveler of this invention.

Referring now to FIG. 1, there is shown a four transistor circuit, having transistors 20, 21, 22 and 23, connected in cascade. The audio input signal is connected to resistor 28, which is connected through capacitor 29 and resistor 31 respectively to ground. A capacitor 30 is connected between resistor 28 and the base terminal of transistor 20. Power is provided by voltage supply 25, which is connected to line 25'. Resistor 38 is connected between line 25' and the emitter of transistor 20, and the collector of transistor 20 is connected through resistor 39 to ground. Bias is provided by diode 34 and resistor 33 connected in series between 25' and the base of transistor 20, and resistor 32 which is connected between the base and ground. The emitter of transistor 20 is also connected through diode 24 and capacitor 25 to ground, such that when diode 24 is on, capacitor 25 is an effective AC shunt across resistor 38.

The collector of transistor 20 is coupled through capacitor 40 to the base of transistor 21. Resistor 41 is connected between the base and collector of transistor 21, resistor 42 is connected between the collector and line 25', and resistor 43 is connected between the emitter and ground.

The collector of the second stage transistor 21 is direct coupled to the base of the third stage transistor 22, which is connected in common emitter configuration, having its collector tied directly to line 25' and its emitter connected through output resistor 45 to ground. Resistor 45 is the volume control for the system, and is provided with a variable tap 46 connected to the audio output terminal 46'.

The emitter of third stage transistor 22 is coupled through capacitor 48 to the base of peak detector transistor 23, the base also being connected through resistor 49 to line 25'. The emitter of transistor 23 is connected through resistor 50 to 25', and the collector is connected through resistor 55 tO ground. Additionally, there is provided a feedback path 56 connecting the collector of transistor 23 with terminal 57 between diode 24 and capacitor 25.

In operation, the audio output, suitably provided from the detector of a receiver, is connected to input resistor 28 and coupled through capacitor 30 to the base of the first stage transistor 20. The output of the first stage is amplified by the second stage, and further passed through the third stage emitter follower to provide the normal audio output. The signal coupled through to the last stage is unaffected by the volume setting. Transistor 23, of the peak detector stage, is normally off in the absence of any AC signal, since no forward biasing is provided. However, as an audio output appears at the emitter of transistor 22, and consequently at the base of transistor 23, the transistor is turned on every cycle, resulting in a net DC voltage appearing across R55. Capacitor 25, which shunts resistor 55, acts as a filter for the DC voltage, such that a DC level appears at terminal 57 which reflects the magnitude of the audio input.

The overall response of the circuit of FIG. 1 is understood by an examination of the effect on diode 24 of the feedback DC voltage at terminal 57, and in turn the effect of the bias of diode 24 on the operation of transistor 20. For very low signals, there is a very low positive voltage at terminal 57, such that diode 24 is appreciably forward biased. Under these circumstances, there is a DC path to ground from the emitter of transistor 20 through diode 24, feedback line 56 and resistor 55. This path shunts transistor 20, causing appreciable voltage drop across resistor 38 and diverting current away from transistor 20. This action causes transistor 20 to run at a very low current and on the low end of its gain vs current curve. Consequently, for low input signal levels corresponding to the noise level of the receiver, transistor 20 provides very little gain, resulting in appreciably zero output for the entire circuit. See FIG. 2, illustrating the noise level of a receiver tested, and showing that the response of a circuit built according to this invention dropped to appreciably zero for inputs within the receiver noise range.

When the audio input signal is raised from zero, an input level is reached where the feedback to terminal 57 is sufficient to begin to back bias diode 24, so as to reduce the effectiveness of such diode as a DC shunt, and cause the transistor to operate at a higher point of its gain vs current curve. Thus, above such signal level, increasing audio inputs cause an increasing of back bias on diode 24, with a resulting increase in gain from transistor 20. This is seen as portion A of the actual circuit response in FIG. 2, where for increases of the audio input above the noise level there is a corresponding steep increase of the audio output. Through this area of rise in the output vs input curve, stability is maintained since there is AC degeneration in the stage through resistor 38.

As the output of transistor 22 increases even further, corresponding to increases in audio input, transistor 23 is turned on harder, and the positive voltage level at point 57 rises further. This tends to further back bias diode 24 such that the shunting effect of capacitor 25 is increasingly diminished, causing increasing dynamic degeneration due to resistor 38. At the point where the increasing degeneration effectively offsets the increase in gain, designated as B on the actual circuit response curve of FIG. 2, the circuit response effectively levels off. This point, which is referred to as the threshold, is an effective break point between the region A of substantially linear increase and the region C of substantially constant response for increasing audio inputs.

Figure 2:
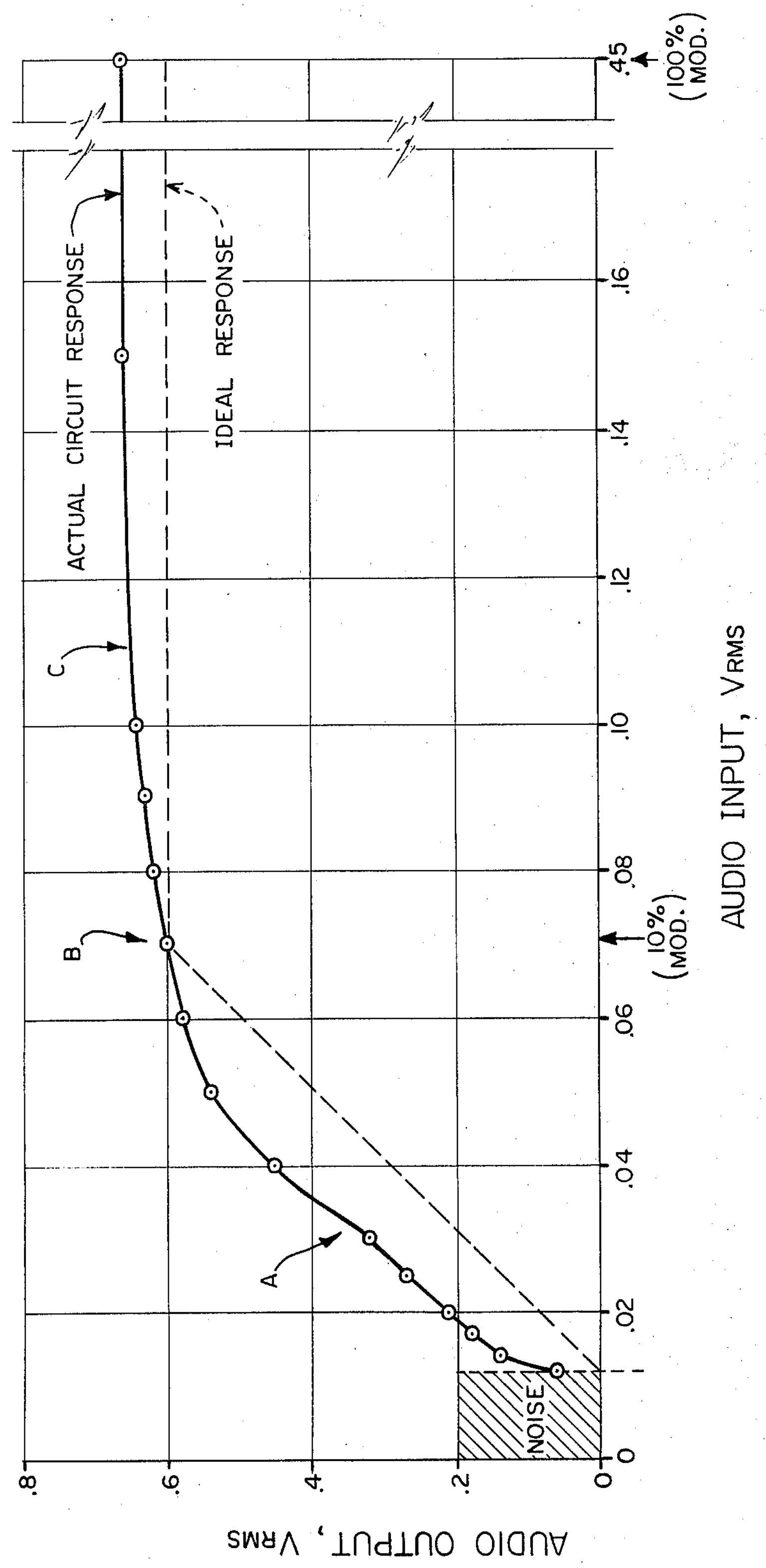
FIG. 2 is a graph showing the ideal response of the audio leveler of this circuit, and the actual circuit response as obtained under test conditions.

As shown in FIG. 2, the ideal response would be one providing no output for inputs below the noise level characteristic of the receiver being utilized. Thus, for the receiver with which the circuit of this invention was tested, the input noise is characteristically about 0.012 volts RMS. The ideal response would be zero output up to such level, with a linearly increasing output up to a second input level (illustrated as 0.07 VRMS), and a constant response thereafter.

As can be seen in FIG. 2, the circuit as described in FIG. 1 was tested by varying the percentage of modulation of the carrier input to a communications receiver, the percentage modulation corresponding to the detected audio signal connected to R28. For this communications receiver, the threshold was chosen corresponding to 10 percent modulation, which corresponded to an audio input signal of about 0.07 VRMS. It is, of course, understood that the threshold may be chosen corresponding to any percentage of modulation, or any signal level. As seen from a comparison of the actual circuit response with the ideal response, the increase to the threshold point was substantially linear, and the system held the output level within about 1.5 *db* as the input level was increased 14 *db* from the threshold.

The threshold level may be determined by choosing resistor 28 to limit the input current and thus specify the audio input level where threshold occurs. Alternately, resistor 55 (across which the feedback voltage is developed) may be selected to determine threshold. Further, capacitors 29 and 30 may be selected for frequency shaping, i.e., limiting the frequencies which are passed through the leveler circuit. Due to the decrease in output for signal levels below the threshold level, the frequency shaping is enhanced at the output of the circuit of this invention.

It is understood that the circuit of this invention is not limited to the precise embodiment as illustrated, but that equivalent circuits which utilize the normal features of this invention also fall under the scope of the invention as claimed. The types of active devices and values of the circuit components utilized in this invention are selected in accordance with known engineering principles.

I claim:

1. An audio leveler circuit comprising:

a. input means for receiving an audio input signal;

b. a plurality of cascaded active stages, the first of said stages being connected to said input means;

c. audio output means connected to one of said stages prior to the last stage, for providing an audio output;

d. said last stage being a peak detector for developing at its output a level signal representative of said audio input signal;

e. said first stage having an active device, a fixed conductance circuit connected to said active device, and a variable conductance circuit also connected to said active device, said variable conductance circuit providing a current shunt to said active device; and f. feedback connecting means for connecting said peak detector output to said variable conductance circuit, said level signal operating on said variable conductance circuit such that said first stage current increases as the input signal increases above a first level so as to increase first stage gain, and said level signal operating on said variable conductance circuit to cause AC degeneration and reduction in first stage gain as the input signal increases above a second level.

2. The audio leveler circuit as described in claim 1, wherein said variable conductance circuit has a diode, and said feedback connecting means connects said level signal to said diode so as tO control the bias of same.

3. The audio leveler circuit as described in claim 2 wherein said variable conductance circuit and said feedback connecting means provides a DC path shunting the active device of said first stage when said diode is conductive, and comprising capacitance connected to said diode providing an AC path shunting said fixed conductance path when said diode is conductive.

4. The circuit as described in claim 3 wherein said input means comprises frequency shaping components.

5. The circuit as described in claim 3 wherein said first stage active device operates at low gain when said diode is biased to provide a high conductance path to DC, and wherein said fixed conductance circuit is AC degenerative, such that:

a. for low audio input levels, said diode is forward biased and said first stage active device operates at low gain, such that said audio output is appreciably zero;

b. as said audio input increases from said low levels, said diode is back biased such that said first stage active device operates at an increased gain, and said audio output rises appreciably linearly; and c. for audio input signals above a threshold level, said diode is back biased such that the increase in operating gain of said first stage active device is offset by the AC degeneration of said fixed conductance circuit, such that said audio output is appreciably level for a range of audio input level above said threshold level.

6. An audio leveler circuit comprising:

a. input means for receiving an audio input signal;

b. a plurality of cascaded active stages, the first of said stages being connected to said input means;

c. audio output means connected tO one of said stages prior to the last stage, for providing an audio output;

d. said last stage being a peak detector for developing at its output a level signal representative of said audio input signal;

e. feedback connecting means for connecting said peak detector output to said first stage, so as to feedback said level signal; and f. said first stage having pre-determined current gain characteristic and having gain control means responsive to said level signal for i. causing said first stage current to be low so that said first stage gain is low and the circuit operates at substantially zero output, for input signals below a given level, ii. causing said first stage current to increase so that said first stage operates at a gain which increases directly with the input signal for a range of input signals above said given level, and iii. causing AC degeneration in said first stage so that said first stage gain decreases for input signals above said range, whereby the circuit output is substantially constant for input signals above said range.

* * * * *